United States Patent [19]

Hambor et al.

[11] 4,241,360
[45] Dec. 23, 1980

[54] SERIES CAPACITOR VOLTAGE MULTIPLIER CIRCUIT WITH TOP CONNECTED RECTIFIERS

[75] Inventors: John G. Hambor, Colt's Neck; James G. Bickel, Wayside, both of N.J.

[73] Assignee: Galileo Electro-Optics Corp., Sturbridge, Mass.

[21] Appl. No.: 932,610

[22] Filed: Aug. 10, 1978

Related U.S. Application Data

[63] Continuation-in-part of Ser. No. 728,615, Oct. 1, 1976, abandoned.

[51] Int. Cl.³ .......................................... H01L 29/06
[52] U.S. Cl. ...................................... 357/56; 357/51; 357/73; 357/76; 357/80; 363/59
[58] Field of Search ................. 357/73, 76, 56, 51, 357/80; 363/59, 60, 61

[56] References Cited

U.S. PATENT DOCUMENTS

| | | | |
|---|---|---|---|
| 3,105,922 | 10/1963 | Fukui et al. | 357/76 |
| 3,584,287 | 6/1971 | Binoche | 357/76 |
| 3,593,107 | 7/1971 | Chilton et al. | 357/76 |
| 3,619,734 | 11/1971 | Assour et al. | 357/76 |
| 3,646,408 | 2/1972 | Kastner | 357/76 |
| 3,900,788 | 8/1975 | Behn et al. | 363/59 |
| 3,908,184 | 9/1975 | Anazawa et al. | 357/80 |
| 3,982,267 | 9/1976 | Henry | 357/76 |

FOREIGN PATENT DOCUMENTS 1931667  8/1970  Fed. Rep. of Germany ............ 357/76

*Primary Examiner*—Joseph E. Clawson, Jr.

[57] ABSTRACT

A miniature thick-film hybrid voltage multiplier comprising a metallized ceramic substrate, silicon diodes, and wire bonded electrical connections. The ceramic metallization patterns provide the required capacitors, appropriate diode soldering areas, and most circuit connections. The remaining circuit connections are made by bonding wires to provide for either series or parallel multiplier circuit arrangements.

12 Claims, 10 Drawing Figures

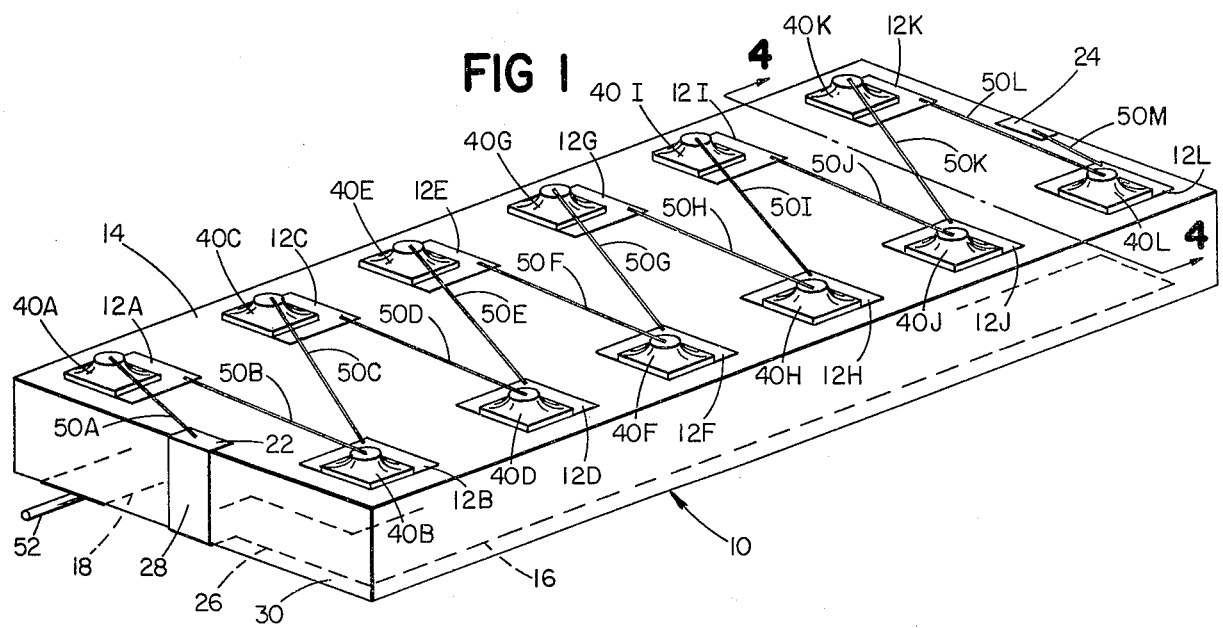
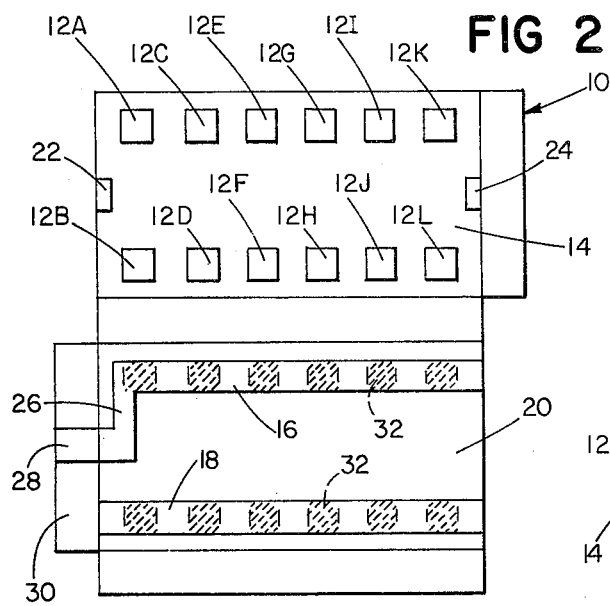
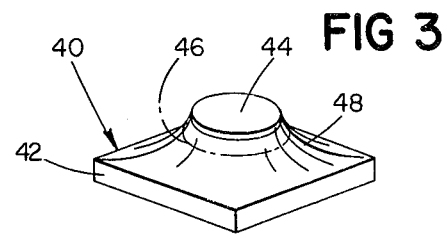
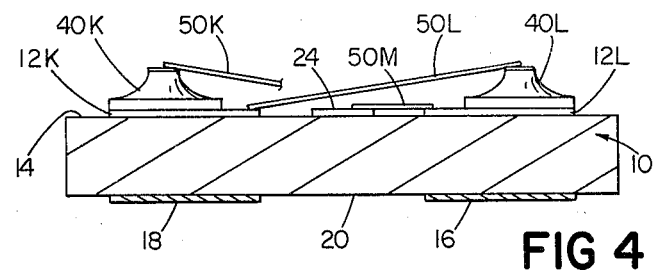
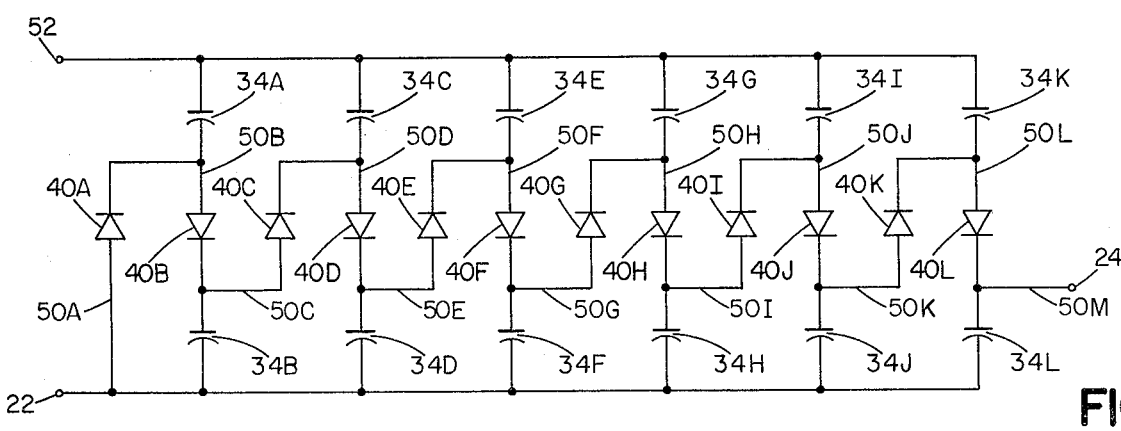

SERIES CAPACITOR VOLTAGE MULTIPLIER CIRCUIT WITH TOP CONNECTED RECTIFIERS

This is a continuation-in-part of application Serial No. 728,615, filed Oct. 1, 1976, now abandoned entitled ELECTRICAL CIRCUIT.

SUMMARY OF THE INVENTION

This invention relates to electrical circuits and more particularly to miniaturized capacitor-semiconductor device circuits that utilize thick film technology.

The invention features a capacitor-semiconductor device circuit comprising a dielectric substrate with an array of metallized capacitor plates on one surface of the substrate and corresponding metallization on the opposite surface to form a plurality of capacitors. A plurality of mesa type semiconductor devices are connected in electrical circuit with the capacitors. Each semiconductor device has a lower surface that is bonded to a metallized area to provide a direct electrical connection to a capacitor plate and an upper metallized surface to which a wire is soldered or otherwise appropriately bonded. Each such wire provides an electrical connection between the semiconductor device and a metallized area different from the capacitor plate to which the lower surface of the semiconductor device is connected.

Preferred embodiments are voltage multiplier circuits in which each semiconductor device is a diode, which may be of either the single junction or multiple junction type. The semiconductor devices may be mounted directly on a capacitor plate or on a mounting pad spaced from and connected to the capacitor plate by a metallized conductor. All the semiconductor devices and wire interconnections are on the upper surface of a ceramic substrate. Metallized connections over the edge of the substrate provide interconnections between capacitors.

In particular voltage multiplier embodiments, the substrate comprises two ceramic strips, each of which has an array of metallization areas and on each of which multijunction mesa diodes are mounted. The two ceramic strips are spaced from one another by an insulation strip of epoxy, mica or like material. Such multipliers are significantly more efficient and it is believed that such increase in efficiency is due to reduced stray capacitance between the two longitudinal rows of capacitors.

The invention provides miniaturized capacitor-semiconductor device circuit products that utilize thick film technology and facilitate efficient and economical circuit manufacture. Voltage multiplier circuitry according to the invention may be of either the parallel or the series type and the mesa diodes may be either the cathode base or the anode base type. Such voltage multipliers are compact and sturdy units and provide reliable high voltage operation in which increased efficiency is obtained because of the lower values of reverse leakage current obtained with the smaller area mesa diodes than with larger area discrete diodes. The hybrid circuitry results in a greater degree of miniaturization and lower cost of manufacture than can be obtained by the present state of discrete diode and capacitor technology.

Further features and advantages will be seen as the following description of particular embodiments progresses, in conjunction with the drawings, in which:

FIG. 1 is a perspective view of a parallel voltage multiplier in accordance with the invention;

FIG. 2 is a development view of surfaces of the metallized substrate employed in the multiplier shown in FIG. 1;

FIG. 3 is a perspective view of a high voltage mesa diode employed in the multiplier of FIG. 1;

FIG. 4 is a sectional view taken along the line 4—4 of FIG. 1;

FIG. 5 is a schematic diagram of the parallel voltage multiplier shown in FIG. 1;

DESCRIPTION OF PARTICULAR EMBODIMENTS

Figure 6:
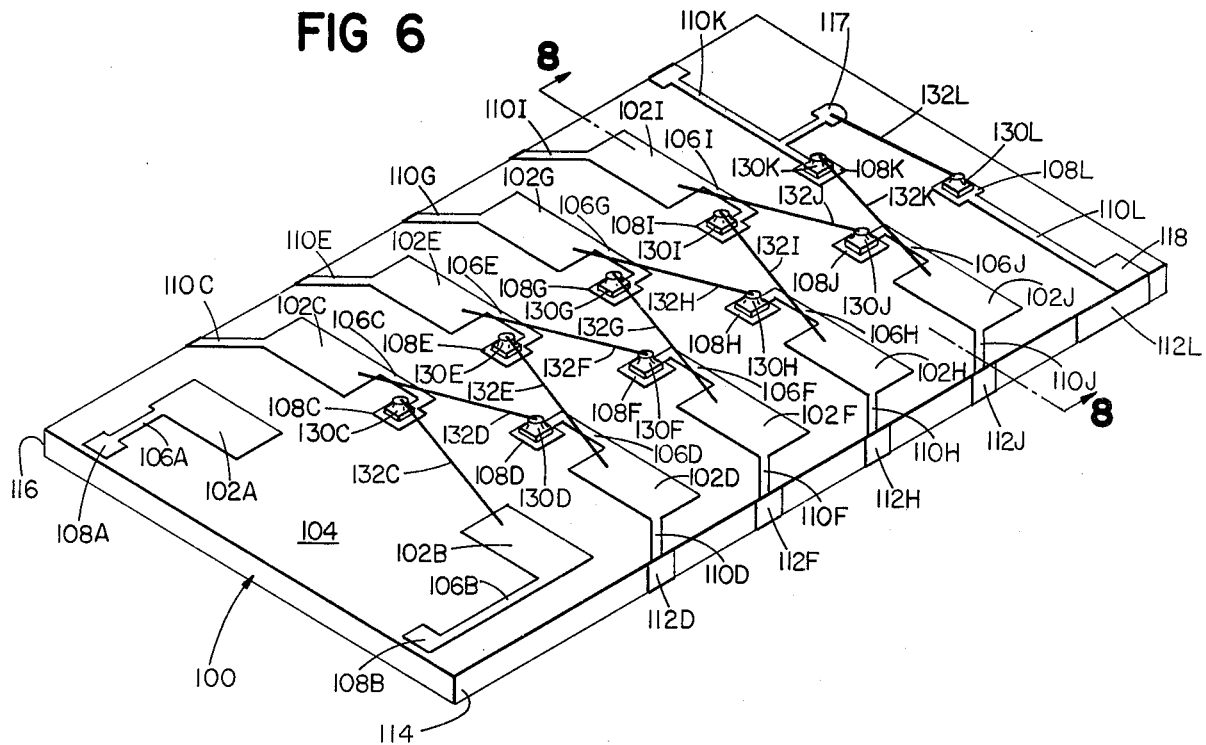
FIG. 6 is a perspective view of a series voltage multiplier in accordance with the invention.

Shown in FIG. 1 is a parallel type voltage multiplier of 6000-volt rating that includes a ceramic (e.g. barium titanate) substrate 10, 0.5 inch long, 0.2 inch wide and 0.06 inch thick. An array of twelve rectangular metallized capacitor plates 12A-12L is formed on the upper surface 14 of substrate 10 and cooperate with two metallized conductor strips 16, 18 (indicated by dashed lines in FIG. 1) that are formed on the lower surface of substrate 10.

The metallization patterns on the upper and lower surfaces 14, 20 of substrate 10 are shown in development view in FIG. 2. In addition to the array of twelve metallized capacitor plates 12 (arranged in two rows of six capacitor plates each) there is a metallized input connector pad 22 at one end of surface 14 and a metallized output connector pad 24 at the opposite end of surface 14. Strip 18 includes an offset section 26 that is connected to input pad 22 by metallized strip 28 on edge surface 30. Strip 16 on the bottom surface 20 is aligned with capacitor plates 12B, 12D, 12F, 12H, 12J and 12L on upper surface 14, and each portion 32 of strip 16 directly under a capacitor plate (diagrammatically indicated in FIG. 2 by diagonal shading) forms the effective capacitance 34. Strip 18 similarly includes portions 32 that are symmetrical with plates 12 and cooperate to form capacitors 34. The value of capacitance is directly proportional to the area of the aligned metallization patterns 12, 32 and the dielectric constant of the substrate 10 and is indirectly proportional to the distance separating the top and bottom surface 14, 20. Additional metallization patterns on surface 14 and 20 that provide electrical connections to other capacitor plates, to semiconductor devices, and to connector pads, are not a source of capacitance due to the absence of symmetry with a corresponding metallized area on the opposite surface of the substrate.

A mesa diode 40 of configuration as shown in FIG. 3 is mounted on each capacitor plate 12. Each diode 40 is of seventy-five ohm centimeter n-type silicon material and has a square base 42, 0.04 inch on a side. The diode is 0.01 inch in height and its upper surface is a circular metallized area 44, 0.006 inch in diameter. Spaced from and parallel to metallized surface 44 is a p-n junction 46 that has an effective diameter of about 0.008 inch. Diode 40 is a high voltage diode and has a minimum peak inverse voltage rating of 1200 volts, a maximum reverse leakage current rating of ten nanoamperes at −1200 volts; and a maximum diode capacitance rating of 0.3 picofarads at −500 volts. Diodes 40 are produced from a slice of n-type silicon with a p-type impurity diffused into its upper surface. The slice is then masked with a uniform pattern of acid resistant metallization dots 44, and chemically etched to form the sloping surfaces 48. After chemical etching, scribing operations in horizontal and vertical directions between the rows of etched mesas yields the discrete diodes as shown in FIG. 3. The mesa type diodes may be opposite polarity, in which case the base 42 would be the anode and the metallized dot 44 would be the cathode.

The cathode base of each mesa diode 40 is mounted directly on and in one corner of each metallized capacitor plate 12. A gold wire 50, two mils in diameter, is bonded between metallized mesa area 44 of each diode and an adjacent capacitor plate 12. These electrical connections may be accomplished either by soldering or by pellet bonding techniques. With reference to FIGS. 1 and 5, input pad 22 is connected to the anode of diode 40A by bonded wire 50A. Similarly, bonded wire connection 50B extends from capacitor plate 12A to anode 44 of diode 40B. The cathode of diode 40A is bonded to and thus directly connected to the upper plate of capacitor 34A. Similarly, the cathode of diode 40B is directly connected to the upper plate 12B of capacitor 34B. In similar manner diodes 40C–40L are interconnected with capacitors 34C–34L to form the parallel type voltage multiplier circuit shown in FIG. 5. Bonded wire 50M extends from upper plate 12L of capacitor 34L to output pad 24. Common wire 52 is soldered to metallized strip 18 on the bottom surface 20 of substrate 10 to complete the electrical circuit.

A sectional view of a portion of the hybrid unit is shown in FIG. 4. That view shows the last two stages of the multiplier—capacitor 34K (formed of plate 12L and strip 18) and capacitor 34L (formed of plate 12L and strip 16); diodes 40K and 40L; bonded wire connections 50K, 50L and 50M; and output pad 24.

After wiring is complete, the voltage multiplier is coated with a silicone varnish or other high insulation material to protect the p-n junction areas 46 from exhibiting adverse leakage currents and also to eliminate corona phenomena between the several circuit elements. For most circuit applications, the varnished assembly is encapsulated in an epoxy or other insulating material with external leads that provide appropriate input and output electrical connections.

A ten-stage series voltage multiplier in accordance with the invention is shown in FIG. 6. That voltage multiplier includes a barium titanate substrate 100, 1½ inches long, 1 inch wide and 0.03 inch thick. Ten metallized capacitor plate elements 102A–102J are in two rows on the upper surface 104 of the substrate. Connected to each capacitor plate 102 by a metallized conductor strip 106 is an auxiliary pad 108. Also connected to each capacitor plate 102C–102J is a diagonal metallized conductor strip 110 that extends to corresponding metallized conductors 112 on edge surfaces 114 and 116. Further metallized pads 108K and 108L are provided with metallized connections 110K and 110L to edge metallization patterns 112K and 112L, respectively. Connected to conductor 110K is pad 117 and connected to conductor 110L is output pad 118.

Figure 9:
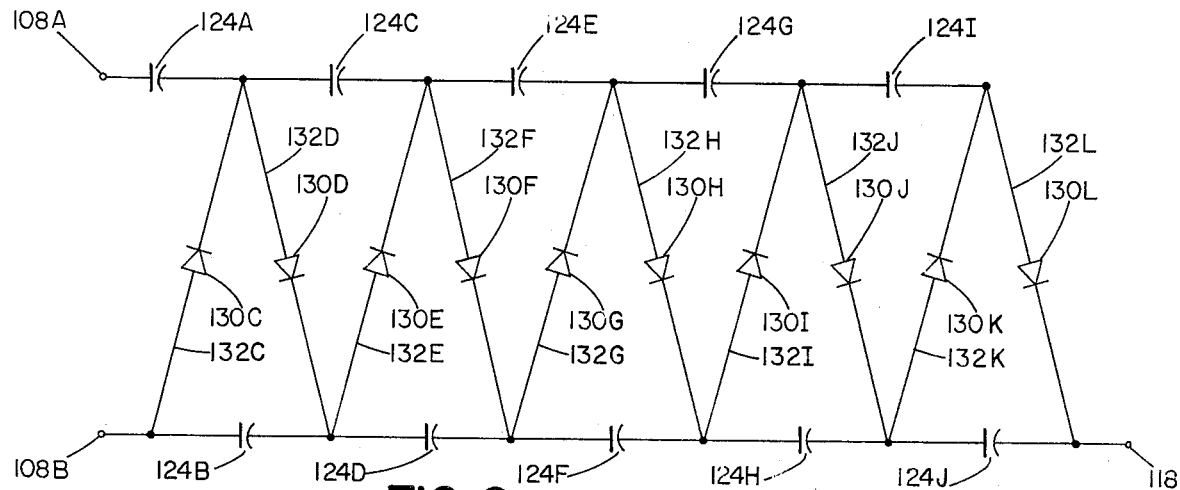
FIG. 9 is a schematic diagram of the series voltage multiplier shown in FIG. 6.
Figure 7:
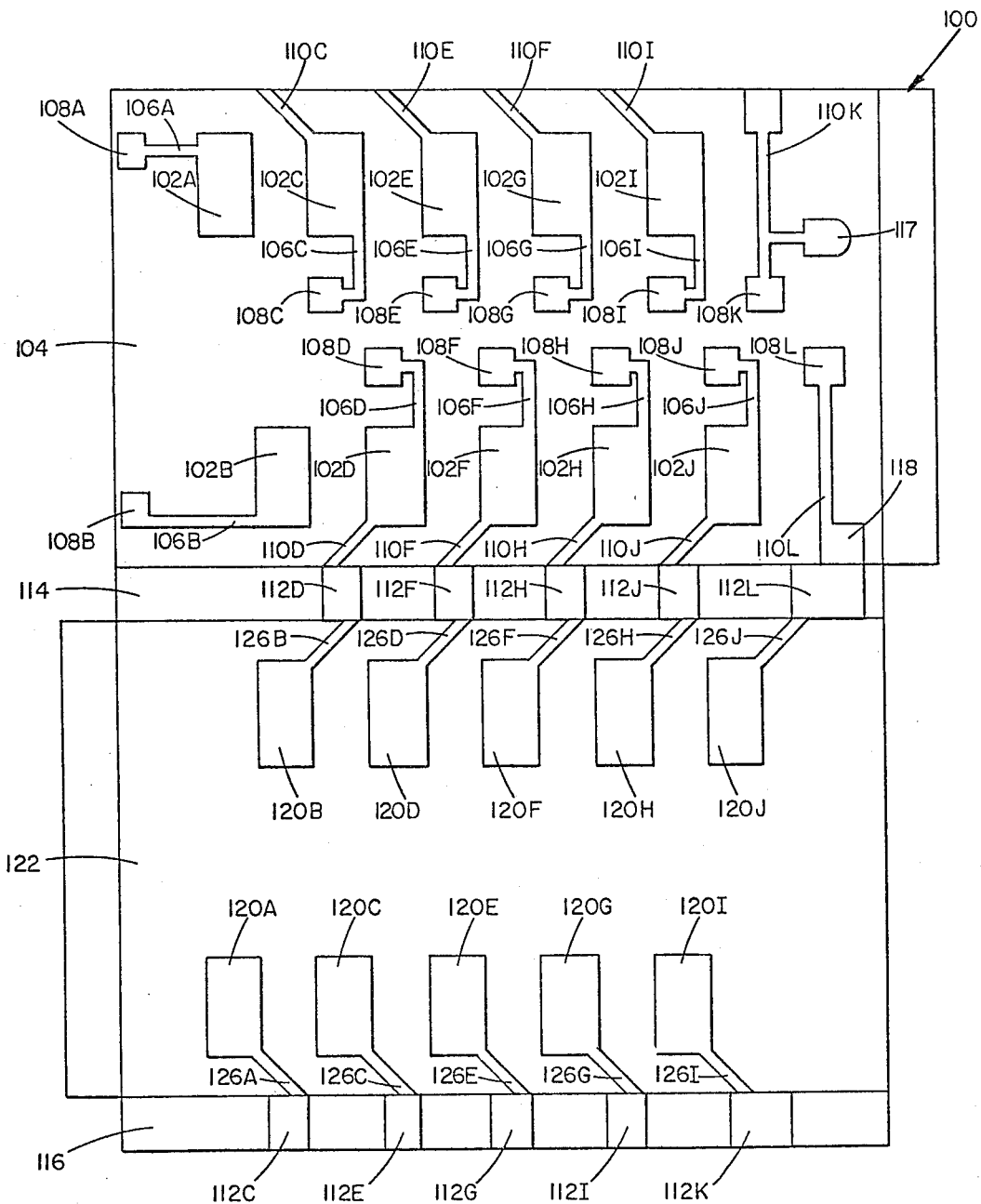
FIG. 7 is a development view of surfaces of the metallized substrate employed in the multiplier shown in FIG. 6.

Ten metallized capacitor plates 120 symmetrically arranged with respect to capacitor plates 102A–102J, are disposed in two rows on lower substrate surface 122 as indicated in the development view of the substrate surface in FIG. 7. Each symmetrical pair of capacitor plates 102 and 120 cooperate to form a capacitor 124. A diagonal metallized conductor connection 126 on surface 122 connects the lower plate 120 of a capacitor to an upper plate 102 of a different capacitor via an edge conductor 112. For example, metallized conductor 126A connects lower capacitor plate 120A to capacitor plate 102C via edge metallization strip 112C and diagonal conductor 110C. Thus, capacitors 124A, C, E, G and I are connected together in series and capacitors 124B, D, F, H and J are connected together in series as indicated in FIG. 9.

Figure 8:
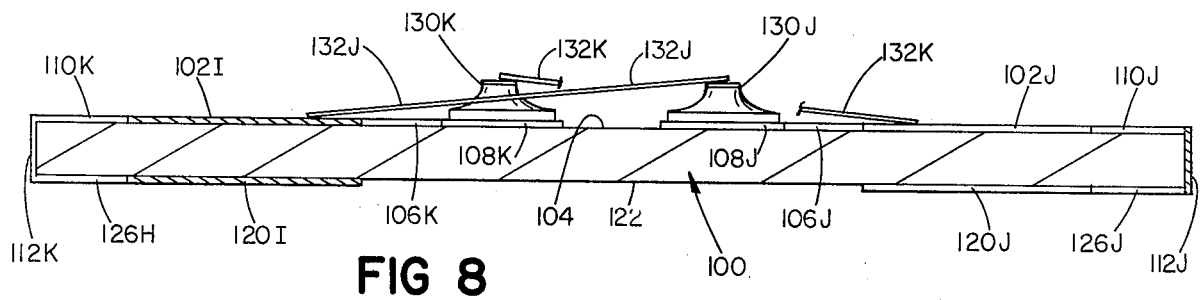
FIG. 8 is a sectional view taken along the line 8—8 of FIG. 6.

Mounted on and bonded to each mounting pad 108C–108L is a high voltage mesa diode 130 of the same type as shown in FIG. 3, with conductor 106 providing a connection from the cathode base 42 of the diode to the corresponding capacitor plate 102. The diode anode 44 is connected by a bonded wire 132 to an adjacent capacitor plate 102. Thus, the anode of diode 130C is connected by wire 132C to capacitor plate 102B. These interconnections are repeated to provide the circuit shown in FIG. 9. A further indication of the physical relation of these connections is shown in FIG. 8. In that sectional view the bonded wire connection 132J from the top of diode 130J to capacitor plate 102I and the bonded wire connection 132K from the top of diode 130K to capacitor plate 102J are shown.

Pad 108A provides an input connection; pad 108B provides a common connection; and pad 118 provides an output connection.

After assembly, the series voltage multiplier unit is coated with silicone varnish or other high insulation material to protect the p-n junction areas and the unit is suitably encapsulated with provision for external input and output terminations.

Figure 10:
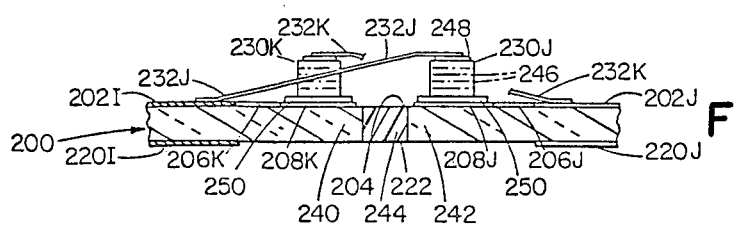
FIG. 10 is a sectional view similar to FIG. 8 showing a modified form of series voltage multiplier in accordance with the invention.

The form of another ten stage series voltage multiplier in accordance with the invention is indicated in FIG. 10—a sectional view similar to FIG. 8. That series voltage multiplier incorporates ten high voltage multijunction diodes 230 mounted on auxiliary metallized pads 208 disposed in two rows on the upper surface 204 of substrate 200. That substrate includes two barium titanate strips 240, 242 that are connected together by an epoxy-insulation strip 244 (Hysol Casting Compound type C9-4210). On each ceramic strip 240, 242 are a row of metallized capacitor plates 202, 220, and associated conductor strips 206, 210, 214, 216, and auxiliary pads 208 and 218.

The high voltage multijunction diodes 230 are manufactured by diffusing single crystal silicon wafers with phosphorous and boron to provide p-n junctions; alloying six diffused wafers together with aluminum to provide a six-junction stack; soldering a thin silver disc to the bottom of the stack on the cathode end; cutting the stack horizontally and vertically on a wafering machine to yield 0.030 inch square diodes; soldering a silver lead 232 to the anode end of each diode; and batch etching the diodes. Diodes 230 have substantially higher voltage ratings than single p-n junction diodes. The bottom side of the silver platform 250 of each diode is soldered to its metallized auxiliary pad 208, and its wire 232 is soldered to an adjacent capacitor plate 202. After assembly, the voltage multiplier unit is coated with suitable insulation and suitably encapsulated. A particular advantage of the voltage multiplier construction shown in FIG. 10 over the voltage multiplier construction of FIG. 8 is a marked increase in efficiency, e.g. a FIG. 8 construction has a voltage output of about 6000 volts and a FIG. 10 construction has a voltage output of over 9700 volts.

Numerous variations will be apparent and are within the spirit and scope of the invention.

What is claimed is:

1. A voltage multiplier device of the type having capacitors connected in a first and a second series, and having diodes bridging between said series, said device comprising
   at least one dielectric substrate with upper, lower, and side surfaces,
   a plurality of discrete metallized upper plates on said upper surface,
   a plurality of discrete metallized lower plates on said lower surface,
   said upper plates being aligned with said lower plates to form pairs of upper and lower aligned plates, each pair of aligned plates acting with the intervening substrate to form a capacitor,
   a plurality of metallized paths
   each said path connecting the upper plate of one said pair to the lower plate of an adjacent said pair so as to connect said capacitors in one of said first and second series,
   each said path extending from said upper to said lower surface across said side of said substrate, thereby forming a plurality of discrete metallized paths extending across said side, and
   a plurality of diodes connected between said first and second series, said diode connections being made directly to and only to said upper metallized plates so that diode connections are made to only one surface of said substrate.

2. The circuit of claim 1 wherein said diodes are mounted directly on said plates.

3. The circuit of claim 1 wherein said diodes are mounted on auxiliary metallized pads that are connected to said plates by metallized conductors.

4. The circuit of claim 1 wherein said substrate is of non-organic material.

5. The circuit of claim 4 wherein said non-organic material is ceramic.

6. The circuit of claim 5 wherein said ceramic material is barium titanate.

7. The circuit of claim 1 wherein each said diode has a plurality of p-n junctions in series.

8. The device of claim 1 wherein said plates and capacitors are arranged in a first and a second group and within each said group said capacitors are connected in series by said paths to thereby form said first and second series of capacitors.

9. The device of claim 1 wherein said first series of capacitors are on a first said substrate and said second series are on a second said substrate, each series being interconnected by said metallized paths and the diode connections on any one substrate being only to plates on one surface of that substrate.

10. The device of claim 9 wherein said first and second substrates are insulated from each other so as to thereby raise the voltage output of said device.

11. The device of claim 10 wherein said first and second substrates are generally coplanar and are insulated by an insulation element disposed in a gap separating said substrates.

12. The device of claim 8 wherein said insulation element has a dielectric constant substantially equal to that of epoxy.

* * * * *